United States Patent
Chiou et al.

(10) Patent No.: US 11,600,319 B2
(45) Date of Patent: Mar. 7, 2023

(54) MEMORY SYSTEM CAPABLE OF PERFORMING A BIT PARTITIONING PROCESS AND AN INTERNAL COMPUTATION PROCESS

(71) Applicant: National Cheng Kung University, Tainan (TW)

(72) Inventors: Lih-Yih Chiou, Tainan (TW); Yu-Wei Lin, Taichung (TW); Wei-Shuo Ling, Kaohsiung (TW)

(73) Assignee: National Cheng Kung University, Tainan (TW)

( * ) Notice: Subject to any disclaimer, the term of this patent is extended or adjusted under 35 U.S.C. 154(b) by 5 days.

(21) Appl. No.: 17/351,280

(22) Filed: Jun. 18, 2021

(65) Prior Publication Data

US 2022/0262426 A1 Aug. 18, 2022

(30) Foreign Application Priority Data

Feb. 17, 2021 (TW) .................................. 110105333

(51) Int. Cl.
  *G11C 7/10* (2006.01)
  *G11C 11/413* (2006.01)
  *G11C 11/408* (2006.01)
  *G11C 11/416* (2006.01)
  *G11C 11/419* (2006.01)

(52) U.S. Cl.
  CPC .......... *G11C 11/413* (2013.01); *G11C 7/1006* (2013.01); *G11C 11/4085* (2013.01); *G11C 11/416* (2013.01); *G11C 11/419* (2013.01)

(58) Field of Classification Search
  CPC .............. G11C 11/413; G11C 11/4074; G11C 11/4085; G11C 11/416
  See application file for complete search history.

(56) References Cited

U.S. PATENT DOCUMENTS

| | | | |
|---|---|---|---|
| 11,322,195 B2 * | 5/2022 | Sinangil | G11C 11/419 |
| 2019/0042160 A1 | 2/2019 | Kumar | |
| 2019/0103156 A1 * | 4/2019 | Sumbul | G11C 7/1006 |
| 2019/0370640 A1 * | 12/2019 | Peng | G11C 11/419 |
| 2021/0366542 A1 * | 11/2021 | Lee | G11C 13/004 |

FOREIGN PATENT DOCUMENTS

| | | |
|---|---|---|
| TW | 202013264 A | 4/2020 |
| WO | WO-2021158861 A1 * | 8/2021 |

\* cited by examiner

*Primary Examiner* — Mushfique Siddique
(74) *Attorney, Agent, or Firm* — Winston Hsu

(57) ABSTRACT

A memory system includes a plurality of first memory units, a plurality of read word lines, and a plurality of read bit lines. Each first memory unit of the plurality of first memory units includes a second memory unit, a first transistor coupled to the second memory unit, and a second transistor coupled to the second memory unit and the first transistor. Each read word line of the plurality of read word lines is coupled to a plurality of first transistors disposed along a corresponding row. Each read bit line of the plurality of read bit lines is coupled to a plurality of second transistors disposed along a corresponding column.

10 Claims, 11 Drawing Sheets

MEMORY SYSTEM CAPABLE OF PERFORMING A BIT PARTITIONING PROCESS AND AN INTERNAL COMPUTATION PROCESS

BACKGROUND OF THE INVENTION

1. Field of the Invention

The present invention illustrates a memory system, and more particularly, a memory system capable of performing a bit partitioning process and an internal computation process.

2. Description of the Prior Art

The idea of artificial neural networks has existed for a long time. Nevertheless, limited computation ability of hardware has been an obstacle to related researches. Over the last decade, there are significant progresses in computation capabilities of processors and algorithms of machine learning. Not until recently did an artificial neural network that can generate reliable judgments becomes possible. Gradually, artificial neural networks are experimented in many fields such as autonomous vehicles, image recognitions, natural language understanding applications, and data mining applications.

Neurons are the basic computation units in a brain. Each neuron receives input signals from its dendrites and produces output signals along with its single axon (i.e., usually provided to other neurons as input signals). The typical operation of an artificial neuron can be modeled as:

$$y = f\left(\sum_i w_i x_i + b\right)$$

Here, $x_i$ represents an input signal of i-th source, y represents an output signal. Each dendrite multiplies a weighting $w_i$ to its corresponding input signal $x_i$ for simulating the strength of influence of one neuron on another. b represents a bias contributed by the artificial neural itself. $f(\bullet)$ represents as a specific transfer function, which is generally implemented as a sigmoid function, a hyperbolic tangent function, or a rectified linear function in a practical computation.

To realize the mathematical model of the neuron network, the number of logical operations of the input signals $x_i$ and the weightings $w_i$, the number of data accesses, and the quantization technology are relevant to the performance of digital accelerators. Currently, the digital accelerator has to communicate with the memory during every data accessing period. However, frequently communicating data between the digital accelerators and the memory may cause high power consumption, high latency, and low transmission rate. Recently years, several accelerators based on computing-in-memory (CIM) have been developed to decrease the data movement in the accelerators. However, a high dimensional analog-to-digital converter is required for applying to the CIM-based accelerators. As a result, the hardware complexity is relatively high. Therefore, the design flexibility of the CIM-based accelerators is decreased. Therefore, it is an important issue to develop a memory system capable of performing a bit partitioning process and an internal computation process for applying to the CIM-based accelerators.

SUMMARY OF THE INVENTION

In an embodiment of the present invention, a memory system is disclosed. The memory system comprises a plurality of first memory units, a plurality of read word lines, and a plurality of read bit lines. Each first memory unit of the plurality of first memory units comprises a second memory unit, a first transistor coupled to the second memory unit, and a second transistor coupled to the second memory unit and the first transistor. Each read word line of the plurality of read word lines is coupled to a plurality of first transistors disposed along a corresponding row. Each read bit line of the plurality of read bit lines is coupled to a plurality of second transistors disposed along a corresponding column.

In another embodiment of the present invention, a memory system is disclosed. The memory system comprises a plurality of first memory units, a plurality of read word lines, and a plurality of read bit lines. Each first memory unit of the plurality of first memory units comprises a second memory unit, a first transistor, and a second transistor. The second transistor is coupled to the second memory unit, a node with a working voltage, and the first transistor. Each read word line of the plurality of read word lines is coupled to a plurality of first transistors disposed along a corresponding row. Each read bit line of the plurality of read bit lines is coupled to a plurality of first transistors disposed along a corresponding column.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
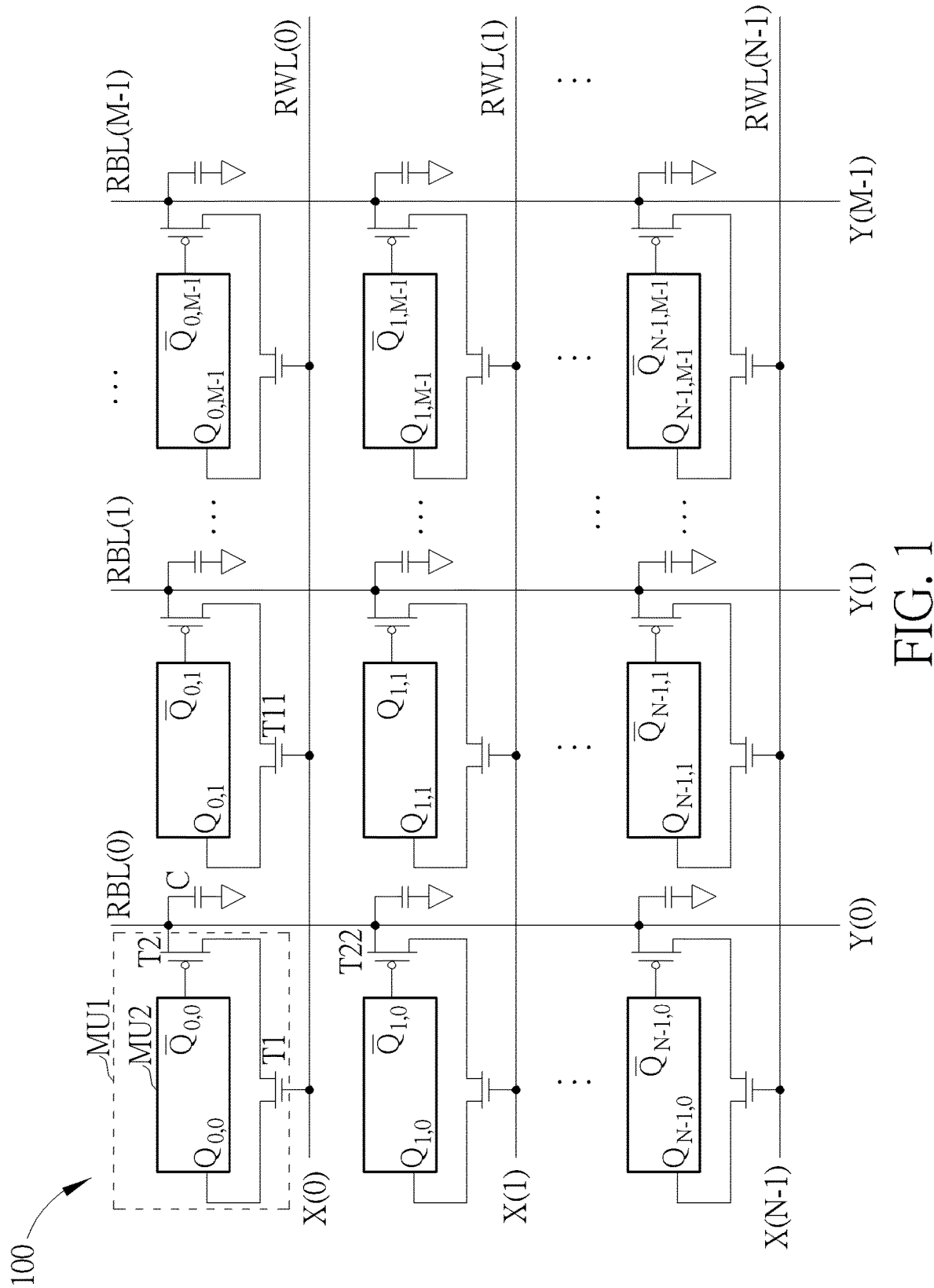
FIG. 1 is a structure of a memory system according to an embodiment of the present invention.
Figure 6:
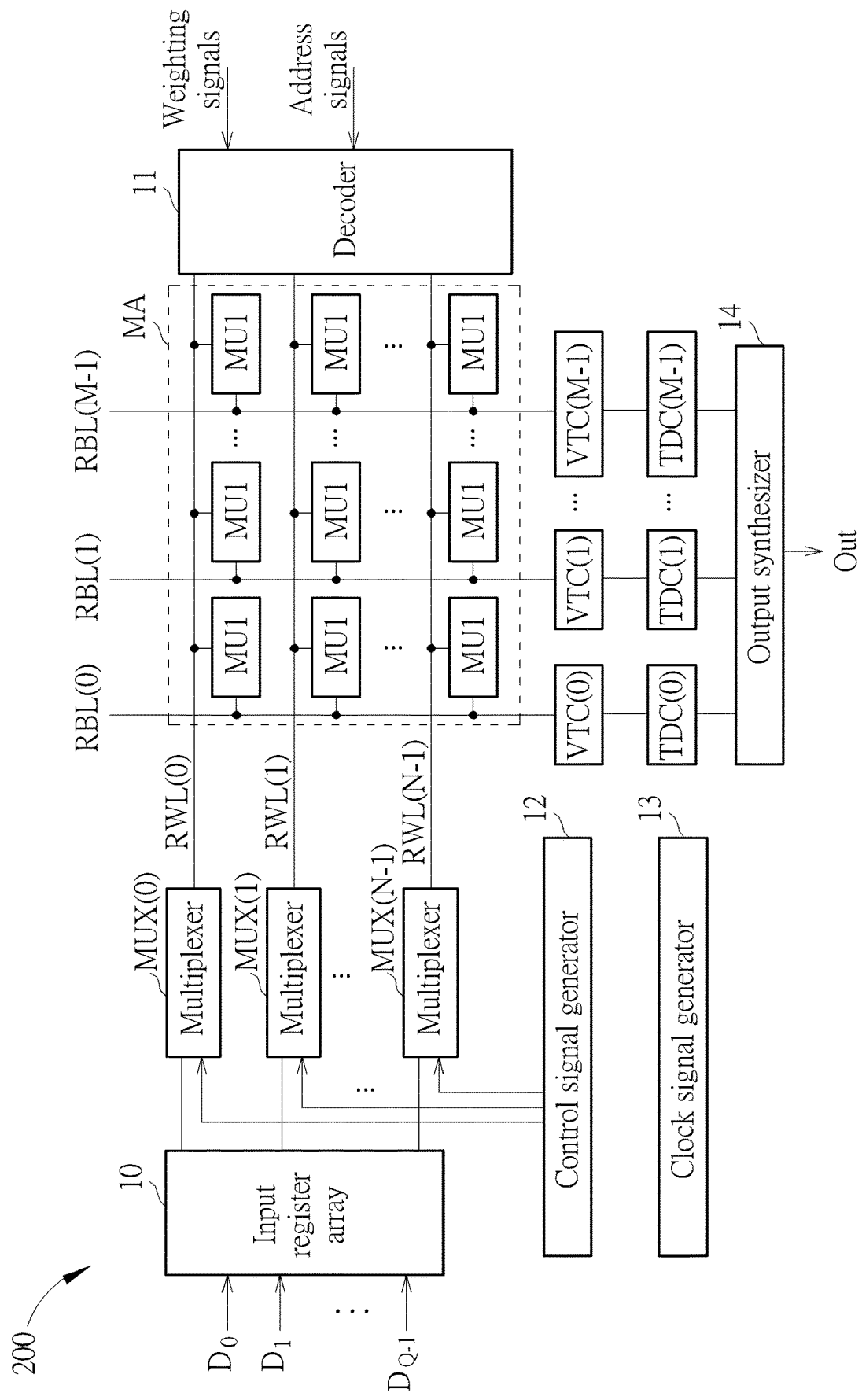
FIG. 6 is an illustration of performing a bit partitioning process by introducing other circuit components of the memory system in FIG. 1.

FIG. 1 is a structure of a memory system 100 according to an embodiment of the present invention. The memory system 100 may include a plurality of first memory units MU1, a plurality of read word lines RWL(0) to RWL(N-1), and a plurality of read bit lines RBL(0) to RBL(M-1). M and N are two positive integers. Each first memory unit MU1 includes a second memory unit MU2, a first transistor T1, and a second transistor T2. The first transistor T1 is coupled to the second memory unit MU2. The second transistor T2 is coupled to the second memory unit MU2 and the first transistor T1. In the memory system 100, the first memory unit MU1 may be a memory unit with an eight transistor-based structure (i.e., a memory unit with an 8T structure). The second memory unit MU2 can be a memory unit with a six transistor-based structure (i.e., a memory unit with a 6T structure). Each read word line of the plurality of read word lines RWL(0) to RWL(N-1) is coupled to a plurality of first transistors disposed along a corresponding row. For example, the read word line RWL(0) is coupled to a first transistor T1 in the first memory unit MU1 at coordinates (0,0). The read word line RWL(0) is also coupled to a first transistor T11 in the first memory unit at coordinates (0,1), and so on. Each read bit line of the plurality of read bit lines RBL(0) to RBL(M-1) is coupled to a plurality of second transistors disposed along a corresponding column. For example, the read bit line RBL(0) is coupled to a second transistor T2 in the first memory unit MU1 at coordinates (0,0). The read bit line RBL(0) is also coupled to a second transistor T22 in the first memory unit at coordinates (1,0), and so on. A plurality of read word lines RWL(0) to RWL(N-1) are used for receiving a plurality of read word line input signals X(0) to X(N-1). For example, a read word line RWL(0) is used for receiving a read word line input signal X(0). A read word line RWL(1) is used for receiving a read word line input signal X(1). A read word line RWL(N-1) is used for receiving a read word line input signal X(N-1). The read word line input signals X(0) to X(N-1) can carry analog signals in a time domain. The plurality of read bit lines RBL(0) to RBL(M-1) are used for outputting a plurality of read bit line output signals Y(0) to Y(M-1). For example, a read bit line RBL(0) is used for outputting a read bit line output signal Y(0). A read bit line RBL(1) is used for outputting a read bit line output signal Y(1). A read bit line RBL(M-1) is used for outputting a read bit line output signal Y(M-1). The read bit line output signals Y(0) to Y(M-1) can also carry analog signals. Here, the N×M first memory units MU1, the read word lines RWL(0) to RWL(N-1), and the read bit lines RBL(0) to RBL(M-1) can form a memory array with a dimension of N×M (i.e., as shown in FIG. 6, a memory array MA). Further, in the memory system 100, a capacitor C can also be used for discharging a current of a read bit line. Each first memory unit has two nodes. Voltages at the two nodes are complementary and determined according to weightings. For example, the two nodes in the first memory unit MU1 at coordinates (0,0) are $Q_{0,0}$ and $\overline{Q}_{0,0}$. The voltages of the two nodes $Q_{0,0}$ and $\overline{Q}_{0,0}$ are complementary and determined according to a weighting $W_{0,0}$. The two nodes in the first memory unit MU1 at coordinates (0,1) are $Q_{0,1}$ and $\overline{Q}_{0,1}$. The voltages of the two nodes $Q_{0,1}$ and $\overline{Q}_{0,1}$ are complementary and determined according to a weighting $W_{0,1}$. The two nodes in the first memory unit MU1 at coordinates (N-1, M-1) are $Q_{N-1,M-1}$ and $\overline{Q}_{N-1,M-1}$. The voltages of the two nodes $Q_{N-1,M-1}$ and $\overline{Q}_{N-1,M-1}$ are complementary and determined according to a weighting $W_{N-1,M-1}$. Further, the weightings $W_{0,0}$ to $W_{N-1,M-1}$ can be predefined by an external circuit, or can be imported from a decoder, or can be temporarily saved in the memory array MA. Further, in the memory system 100, a current of the each read bit line is generated by performing a linear combination on a plurality of currents of the plurality of read word lines RWL(0) to RWL(N-1) according to the weightings $W_{0,0}$ to $W_{n-1,M-1}$. Details are illustrated later.

Figure 2:
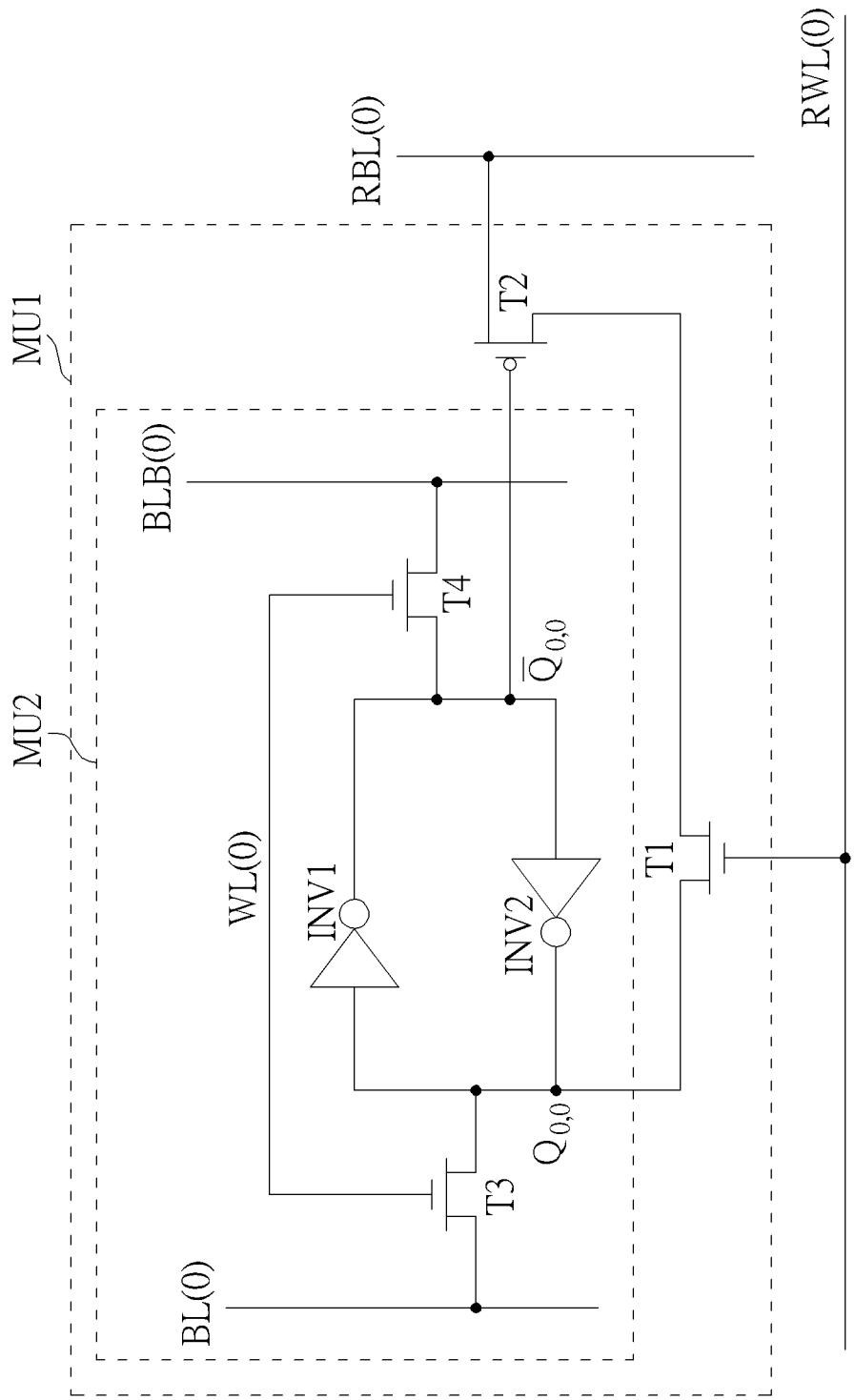
FIG. 2 is a structure of a first memory unit of the memory system in FIG. 1.

FIG. 2 is a structure of the first memory unit MU1 of the memory system 100. As previously mentioned, the first memory unit MU1 includes a second memory unit MU2, a first transistor T1, and a second transistor T2. The second memory unit MU2 includes a third transistor T3, a fourth transistor T4, a first inverter INV1, and a second inverter INV2. The third transistor T3 includes a first terminal coupled to the first bit line BL(0), a second terminal, and a control terminal. The fourth transistor T4 includes a first terminal, a second terminal coupled to the second bit line BLB(0), and a control terminal coupled to the control terminal of the third transistor T3 (i.e., the two control terminals of the third transistor T3 and the fourth transistor T4 are coupled by using a word line WL(0)). The first inverter INV1 includes an input terminal coupled to the second terminal of the third transistor T3, and an output terminal coupled to the first terminal of the fourth transistor T4 and the control terminal of the second transistor T2. The second inverter INV2 includes an input terminal coupled to the output terminal of the first inverter INV1, and an output terminal coupled to the input terminal of the first inverter INV1 and the first terminal of the first transistor T1. Further, the second terminal of the first transistor T1 is coupled to the first terminal of the second transistor T2. The control terminal of the first transistor T1 is coupled to a read word line (i.e., such as a read word line RWL(0)). The second terminal of the second transistor T2 is coupled to a read bit line (i.e., such as a read bit line RBL(0)). Two signals of the first bit line BL(0) and the second bit line BLB(0) are complementary. For example, when the first bit line BL(0) is at a high voltage, the second bit line BLB(0) is at a low voltage. When the first bit line BL(0) is at a low voltage, the second bit line BLB(0) is at a high voltage. Further, when the third transistor T3 is enabled, the voltage of the first bit line BL(0) is equal to a voltage of the node $Q_{0,0}$. When the fourth transistor T4 is enabled, the voltage of the second bit line BLB(0) is equal to a voltage of the node $\overline{Q}_{0,0}$. Further, the first transistor T1, the third transistor T3, and the fourth transistor T4 may be N-type Metal-Oxide-Semiconductor Field-Effect Transistors (N-type MOSFET). The second transistor can be a P-type MOSFET. Any reasonable hardware modification falls into the scope of the present invention.

Figure 3:
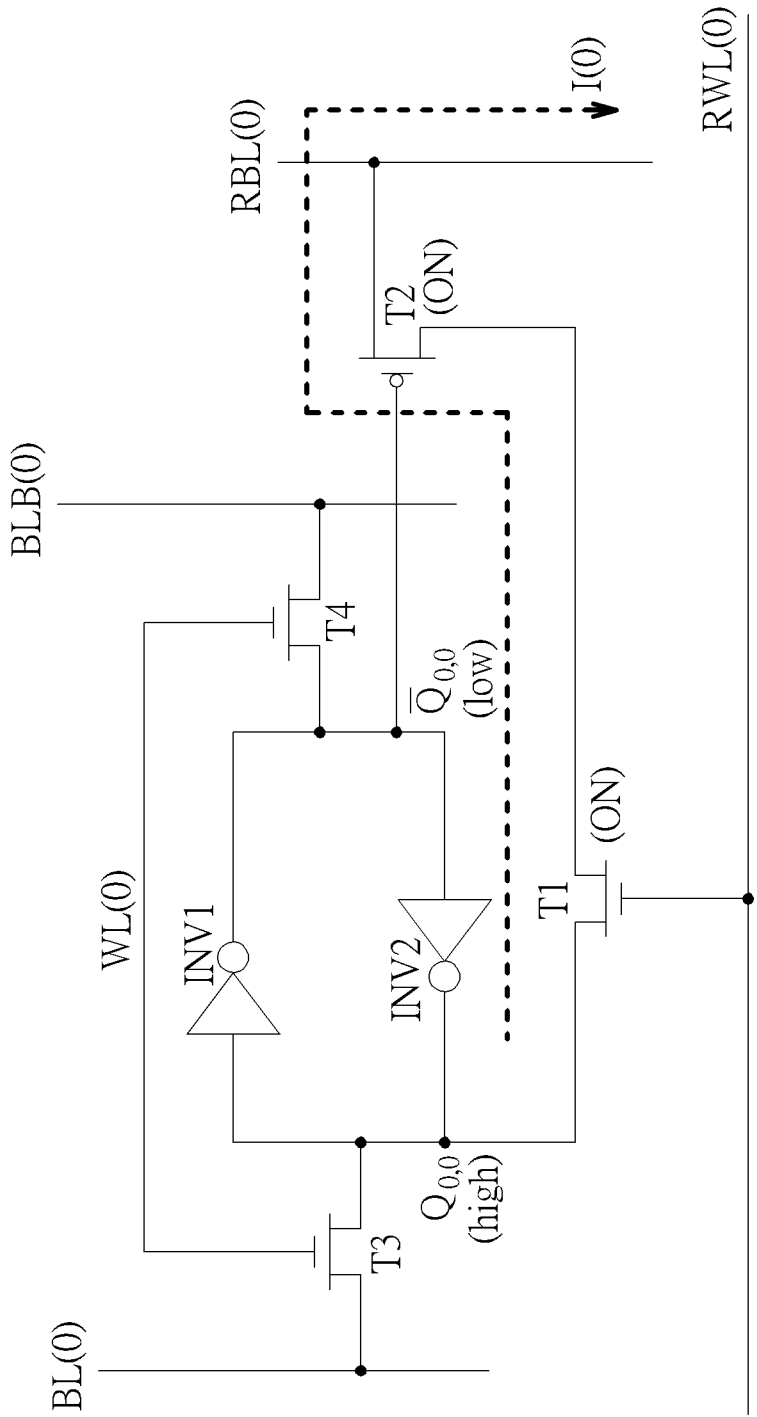
FIG. 3 is an illustration of an output of a read bit line of the memory system in FIG. 1 when a node is at a high voltage.

FIG. 3 is an illustration of an output of a read bit line RBL(0) of the memory system 100 when the node $Q_{0,0}$ is at a high voltage. In FIG. 3, when the node $Q_{0,0}$ is at the high voltage (for example, the weighting $W_{0,0}$ is set as a high voltage), it implies that the input terminal of the first inverter INV1 is at a high voltage. Therefore, the input terminal of the second inverter INV2 is at a low voltage. The node $\overline{Q}_{0,0}$ is at a low voltage. When the read word line RWL(0) is at the high voltage, the first transistor T1 and the second transistor T2 are enabled. Therefore, a current I(0) generated from the node $Q_{0,0}$ through the first transistor T1 and the second transistor T2 to the read bit line RBL(0) can be expressed as $I(0)=I\times\Delta T_{RWL(0)}$. A corresponding voltage V(0) can be expressed as $I\times\Delta T_{RWL(0)}/C_{RWL(0)}$. $C_{RBL}(0)$ is the capacitance of the capacitor C (as shown in FIG. 1). In other words, I(0) is a current outputted from the read bit line RBL(0). I is a constant current at the node $Q_{0,0}$. $\Delta T_{RWL}(0)$ is an analog parameter related to the read word line input signal X(0) inputted by the read bit line RBL(0). In other words, for the read word line input signal X(0), when the node $Q_{0,0}$ is high, the read bit line RBL(0) can output non-zero current I(0) and non-zero voltage V(0) relevant to the read word line input signal X(0).

Figure 4:
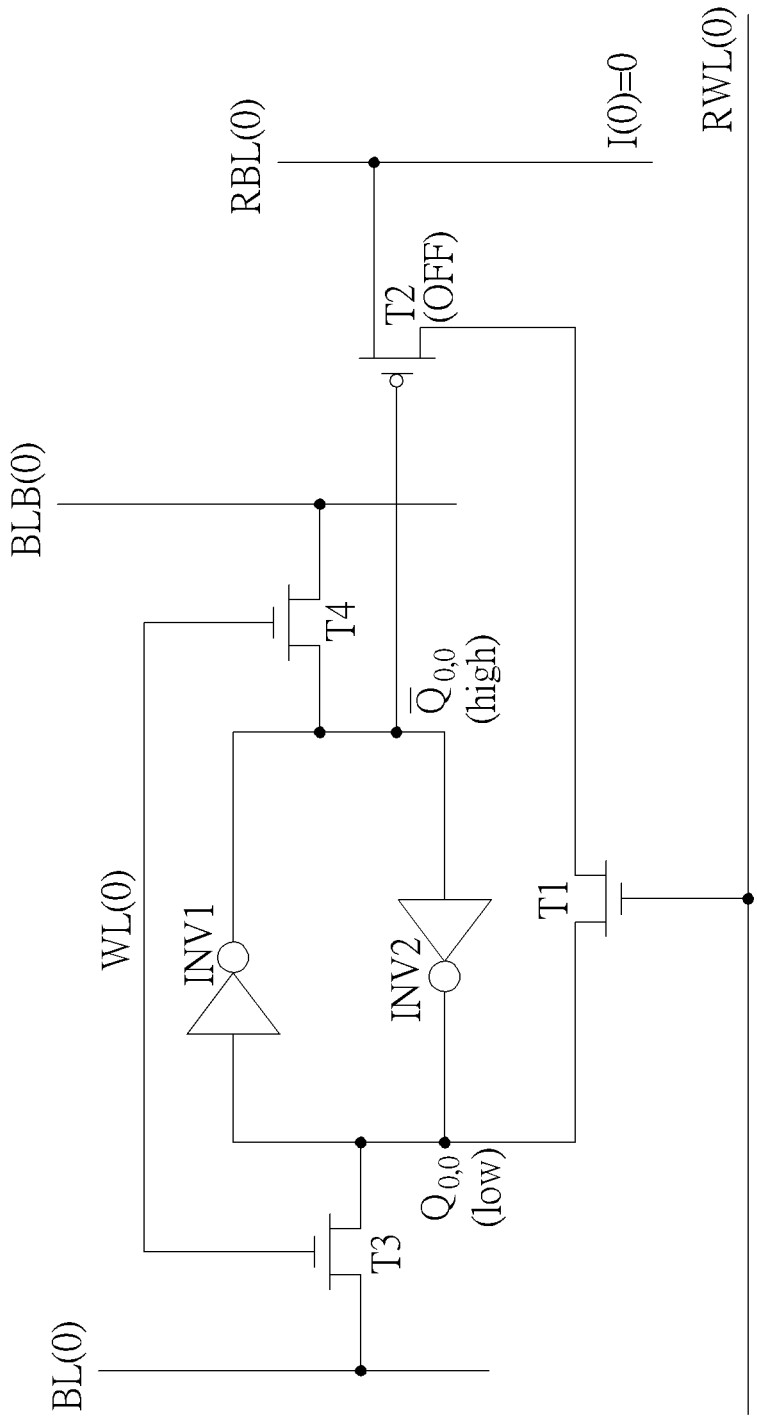
FIG. 4 is an illustration of the output of the read bit line of the memory system in FIG. 1 when the node is at a low voltage.

FIG. 4 is an illustration of the output of the read bit line RBL(0) of the memory system 100 when the node $Q_{0,0}$ is at a low voltage. In FIG. 4, when the node $Q_{0,0}$ is at the low voltage (for example, the weighting $W_{0,0}$ is set to indicate the low voltage), it implies that the input terminal of the first inverter INV1 is at the low voltage. Therefore, the input terminal of the second inverter INV2 is at the high voltage. The node $\overline{Q}_{0,0}$ is at the high voltage. The second transistor T2 is disabled so that a current of the read bit line RBL(0) is blocked (I(0)=0).

In other words, the read word line input signal X(0), the voltage of the node $Q_{0,0}$, and the current of the read bit line RBL(0) can be expressed as Table T1, as follows.

TABLE T1

| voltage of the node $Q_{0,0}$ | current I(0) of the read bit line RBL(0) |
|---|---|
| weighting $W_{0,0}$ is set to indicate a high voltage (i.e., logic "1") | I(0) is related to X(0) ("Logic 1") |
| weighting $W_{0,0}$ is set to indicate a low voltage (i.e., logic "0") | I(0) = 0 ("Logic 0") |

Therefore, for logical operations, in the first memory unit MU1, the current I(0) outputted from the read bit line RBL(0) can be written as $I(0)=X(0)\times W_{0,0}$.

Figure 5:
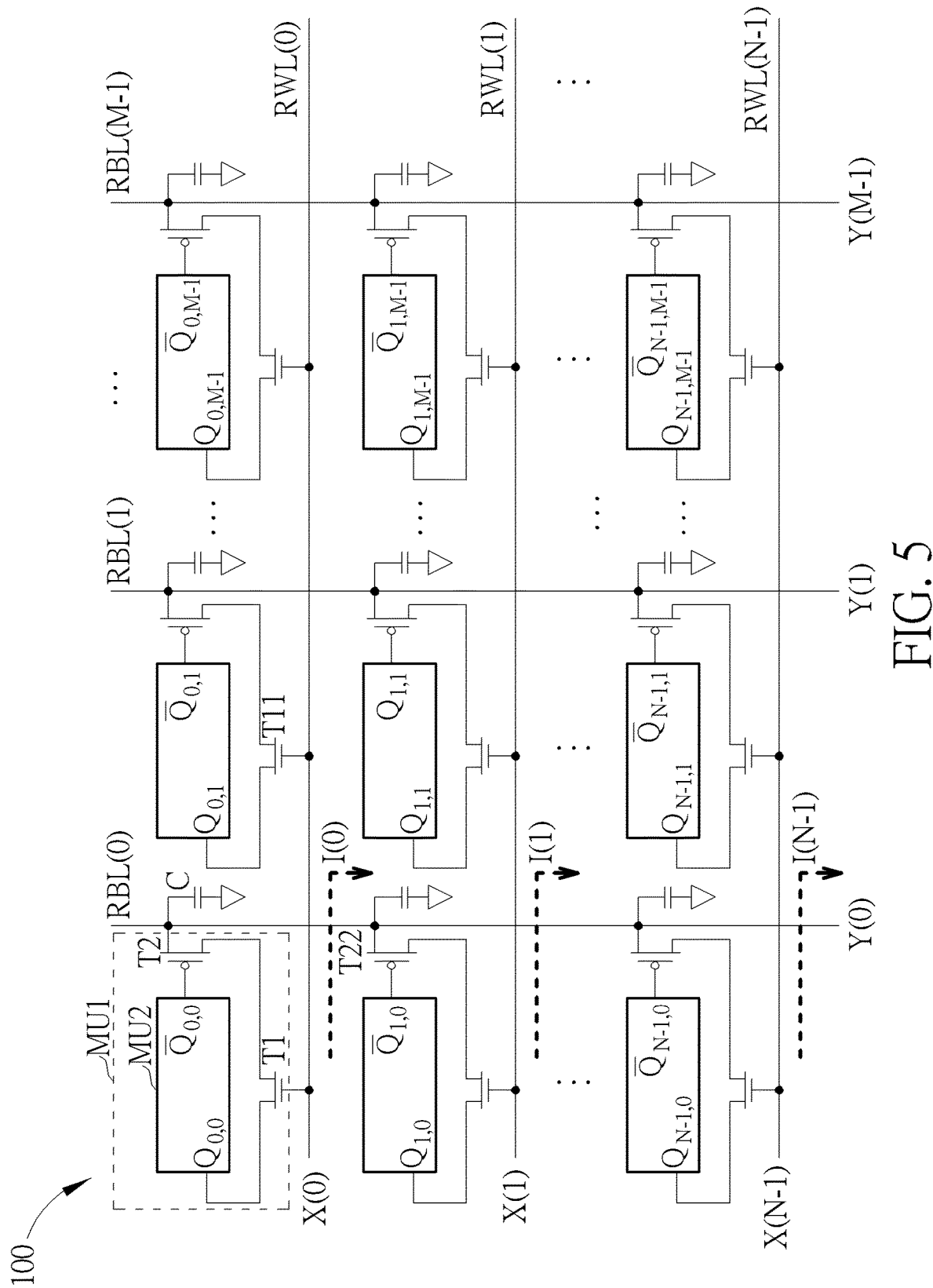
FIG. 5 is an illustration of a read bit line output signal generated by using linear combinations of a plurality of read word line input signals and a plurality of weightings of the memory system in FIG. 1.

FIG. 5 is an illustration of a read bit line output signal Y(0) generated by using linear combinations of a plurality of read word line input signals X(0) to X(N-1) and a plurality of weightings of the memory system 100. As previously mentioned, for logical operations, in the first memory unit MU1, the current I(0) outputted by the read bit line RBL(0) can be written as $I(0)=X(0)\times W_{0,0}$. However, in the memory array MA with a dimension of N×M, the read bit line RBL(0) is coupled to the N first memory units. Particularly, current outputted by the N first memory units can be superimposed on the read bit line RBL(0). Therefore, for the memory array MA with the dimension of N×M, the current of the read bit line output signal Y(0) outputted by the read bit line RBL(0) can be expressed as $Y(0)=\Sigma_{n=0}^{N-1}X(n)\times W_{n,0}$. Generally, current of the read bit line output signal Y(m) outputted by the read bit line RBL(m) can be expressed as:

$$Y(m)=\Sigma_{n=0}^{N-1}X(m)\times W_{n,m}$$

Therefore, the memory system 100 is capable of performing internal logical operations, such as performing logical addition and logical multiplication operations inside the memory array MA.

FIG. 6 is an illustration of performing a bit partitioning process by introducing other circuit components of the memory system 100. To avoid ambiguity, the memory system in FIG. 6 is called as the memory system 200 hereinafter. The memory system 200 may also include an input register array 10, a plurality of multiplexers MUX(0) to MUX(N-1), and a control signal generator 12. The input register array 10 can be used for receiving a plurality of input data vectors $D_0$ to $D_{Q-1}$. Q is a positive integer. The data vectors $D_0$ to $D_{Q-1}$ are digital signal vectors. For example, the data vectors $D_0$ to $D_{Q-1}$ can be 4-bit digital signal vectors, denoted as [0:3]. The multiplexers MUX(0) to MUX(N-1) are coupled to the input register array 10 and the read word lines RWL(0) to RWL(N-1). Each multiplexer can be used for generating a multiplexer output signal according to each input data vector. For example, the multiplexers MUX(0) to MUX(N-1) can be 4-bit multiplexers for receiving a plurality of 4-bits signal vectors outputted from the input register array 10. Further, the multiplexers MUX(0) to MUX(N-1) can be used for outputting the multiplexer output signals. The multiplexer output signals are the read word line input signals X(0) to X(N-1). The control signal generator 12 is coupled to the multiplexers MUX(0) to MUX(N-1) for generating a plurality of control signals to control the multiplexers MUX(0) to MUX(N-1). For example, the control signal generator 12 can generate a plurality of pulse waves having different widths to control the multiplexers MUX(0) to MUX(N-1) for generating read word line input signals X(0) to X(N-1) on a time axis. The memory system 200 may also include a clock signal generator 13 for controlling at least one clock frequency. The memory system 200 may also include a plurality of voltage-to-time converters VTC(0) to VTC(M-1), a plurality of analog-to-digital converters TDC(0) to TDC(M-1), and an output synthesizer 14. The voltage-to-time converters VTC(0) to VTC(M-1) are respectively coupled to the read bit lines RBL(0) to RBL(M-1) for generating a plurality of output signals in the time domain, as a plurality of analog signals. Each analog-to-digital converters TDC(0) to TDC(M-1) is coupled to a corresponding voltage-to-time converter for outputting a digital signal. Further, the analog-to-digital converters TDC(0) to TDC(M-1) can be a plurality of time-to-digital converters for converting output signals generated by the voltage-to-time converters VTC(0) to VTC(M-1) in the time domain into digital signals. The sampling accuracy of the voltage-to-time converters VTC(0) to VTC(M-1) increases with improvement of a manufacturing process of the voltage-to-time converters VTC(0) to VTC(M-1). A dimension of each analog-to-digital converter TDC(0) to TDC(M-1) may be NADC. NADC is a positive integer. For example, the output signal (i.e., analog signal) of the voltage-to-time converter VTC(0) can be quantized with 4 bit levels in the time axis by the analog-to-digital converter TDC(0) to generate a digital signal. The output signal (i.e., analog signal) of the voltage-to-time converter VTC(1) can be quantized with 4 bits in the time axis by the analog-to-digital converter TDC(1) to generate a digital signal. The output signal (i.e., analog signal) of the voltage-to-time converter VTC(M-1) can be quantized with 4 bits in the time axis by the analog-to-digital converter TDC(M-1) to generate a digital signal. Further, in practice, the analog-to-digital converters TDC(0) to TDC(M-1) can be time-to-digital converters. A maximum value of the number of analog-to-digital converters can be designed according to a column dimension N of the memory array MA. For example, each analog-to-digital converter quantizes the output signal of the each read bit line in the time domain into a digital signal with $2^{NADC}$ levels. The number of analog-to-digital converters is smaller than or equal to the column dimension N of the plurality of first memory units. Further, the higher dimension NADC of these analog-to-digital converters TDC(0) to TDC(M-1) is used, the smaller quantization error is introduced. However, the hardware complexity is greatly increased. Conversely, the lower dimension NADC of these analog-to-digital converters TDC(0) to TDC(M-1) is used, the larger quantization error is introduced. However, the hardware complexity is greatly decreased. Therefore, instead of using a single high-dimensional analog-to-digital converter for outputting digital signals, the memory system 200 introduces multiple variable and changeable dimension NADC based analog-to-digital converters TDC(0) to TDC(M-1) for outputting digital signals. In other words, the previously mentioned multiplexers MUX(0) to MUX(N-1)

and dimension NADC based analog-to-digital converters TDC(0) to TDC(M-1) can be used for applying the bit partitioning process of the memory system 200. As a result, the memory system 200 can avoid high design complexity and high energy consumption caused by high-dimensional analog-to-digital converters. The output synthesizer 14 is coupled to the analog-to-digital converters TDC(0) to TDC (M-1) for generating output signals. Eventually, a final output signal of the memory system 200 is a digital signal. Details of a logical structure of the output synthesizer 14 are illustrated below.

Figure 7:
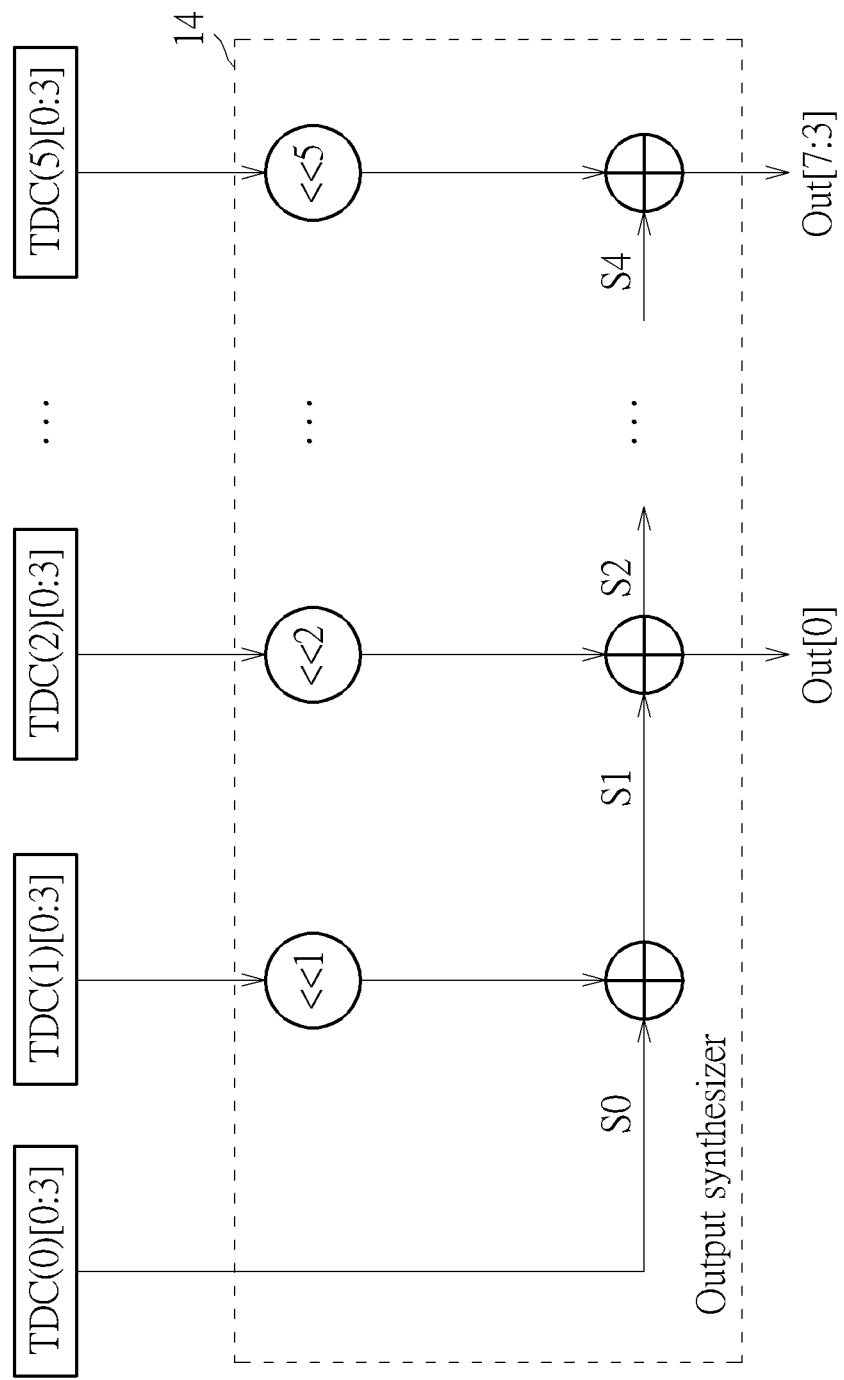
FIG. 7 is a logical structure of a plurality of time-to-digital converters and an output synthesizer in the memory system in FIG. 6.

FIG. 7 is a logical structure of a plurality of time-to-digital converters and an output synthesizer 14 in the memory system 200. Here, the analog-to-digital converters TDC(0) to TDC(M-1) are illustrated as the time-to-digital converters TDC(0) [0:3] to TDC(5) [0:3] (M=6). In FIG. 7, the time-to-digital converters TDC(0) [0:3] to TDC(5) [0:3] have a 4-bit dimension. After the output bit vector of a time-to-digital converter TDC(1) [0:3] is shifted to the left side by 1 bit, it can be added to an output bit vector S0 of the time-to-digital converter TDC(0) [0:3] for generating an output bit vector S1. After the output bit vector of a time-to-digital converter TDC(2) [0:3] is shifted to the left side by 2 bits, it can be added to the output bit vector S1 for generating an output bit vector S2 and outputting a $0^{th}$ bit output signal Out[0], and so on. In order to perform a signed number operation, the output bit vector of the time-to-digital converter TDC(5) [0:3] is shifted to the left by 5 bits. Then, it can be added to the output bit vector S4 for outputting the $3^{rd}$ to $7^{nd}$ bit output signal Out[7:3]. In other words, the output synthesizer 14 can sequentially shift and sum a plurality of digital signals generated by the analog-to-digital converters TDC(0) to TDC(M-1) for generating the output signal Out.

Figure 8:
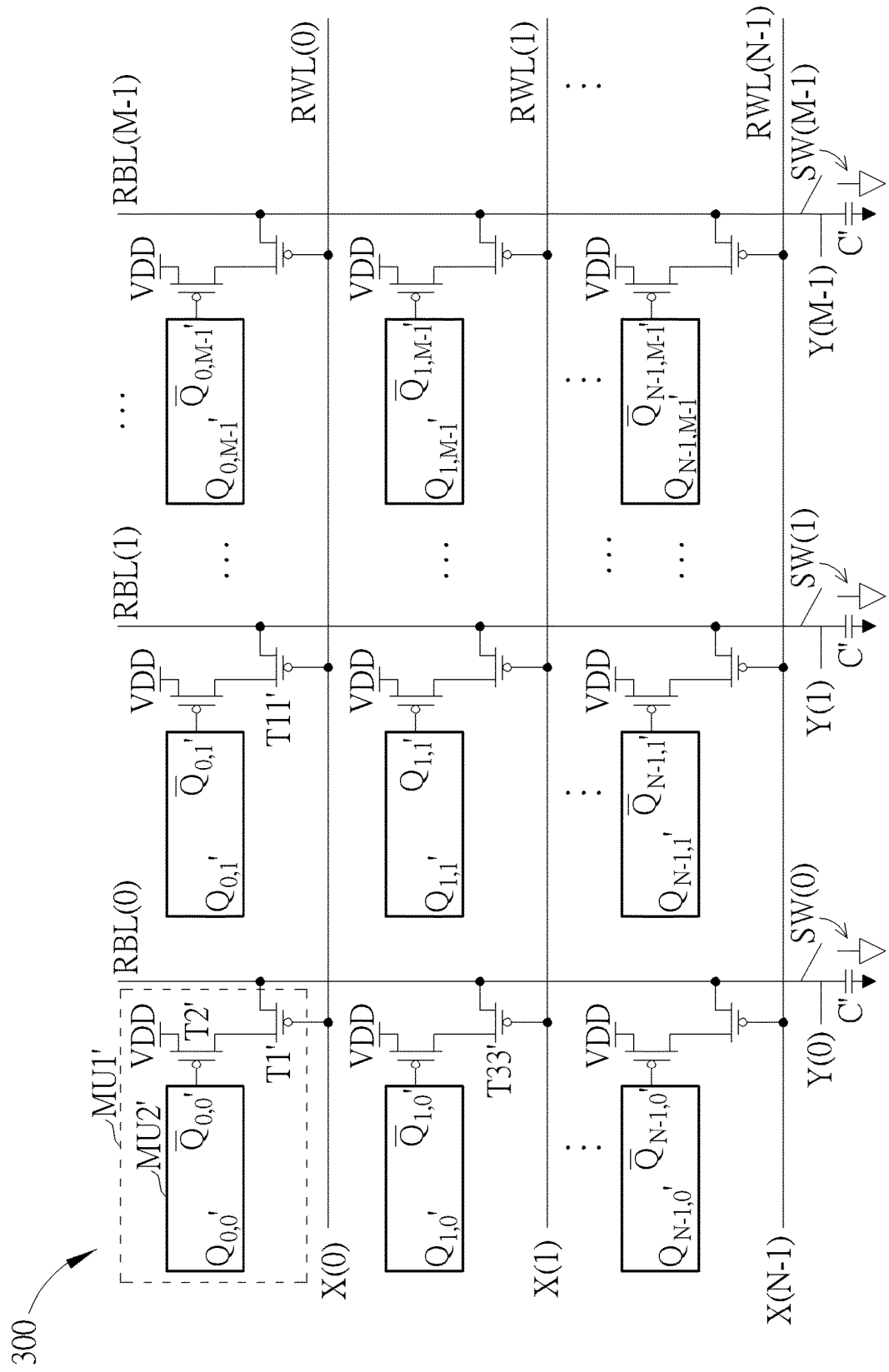
FIG. 8 is another structure of a memory system according to an embodiment of the present invention.

FIG. 8 is another structure of the memory system 100 according to an embodiment of the present invention. To avoid ambiguity, the memory system in FIG. 8 is called as the memory system 300 hereinafter. The memory system 300 may include a plurality of first memory units MU1', a plurality of read word lines RWL(0) to RWL(N-1), and a plurality of read bit lines RBL(0) to RBL(M-1). M and N are two positive integers. Each first memory unit MU1' includes a second memory unit MU2', a first transistor T1', and a second transistor T2'. The second transistor T2' is coupled to the second memory unit MU2' and the first transistor T1'. In the memory system 300, the first memory unit MU1' may be a memory unit with an eight transistor-based structure (i.e., a memory unit with an 8T structure). The second memory unit MU2' may be a memory unit with a six transistor-based structure (i.e., a memory unit with a 6T structure). Each read word line of the plurality of read word lines RWL(0) to RWL(N-1) is coupled to a plurality of first transistors disposed along a corresponding row. For example, the read word line RWL(0) is coupled to the first transistor T1' in the first memory unit MU1' at coordinates (0,0). The read word line RWL(0) is also coupled to the first transistor T11' in the first memory unit at coordinates (0,1), and so on. Each read bit line of the plurality of read bit lines RBL(0) to RBL(M-1) is coupled to the plurality of first transistors in the corresponding column. For example, the read bit line RBL(0) is coupled to the first transistor T1' in the first memory unit MU1' at coordinates (0,0). The read bit line RBL(0) is also coupled to the first transistor T33' in the first memory unit at coordinates (1,0), and so on. A plurality of read word lines RWL(0) to RWL(N-1) are used for receiving a plurality of read word line input signals X(0) to X(N-1). The plurality of read bit lines RBL(0) to RBL(M-1) are used for outputting a plurality of read bit line output signals Y(0) to Y(M-1). Each first memory unit has two nodes. Voltages at the two nodes are complementary and determined according to the weightings. For example, the two nodes in a first memory unit at coordinates (0,0) are $Q_{0,0}'$ and $\overline{Q}_{0,0}'$. The voltages of the two nodes $Q_{0,0}'$ and $\overline{Q}_{0,0}'$ are complementary and determined according to a weighting. The two nodes in a first memory unit at coordinates (0,1) are $Q_{0,1}'$ and $\overline{Q}_{0,1}'$. The voltages of the two nodes $Q_{0,1}'$ and $\overline{Q}_{0,1}'$ are complementary and determined according to a weighting. The two nodes in a first memory unit at coordinates (N-1,M-1) are $Q_{N-1,M-1}'$ and $\overline{Q}_{N-1,M-1}'$. The voltages of the two nodes $Q_{N-1,M-1}'$ and $\overline{Q}_{N-1,M-1}'$ are complementary and determined according to a weighting. Similar to the internal operations of the memory system 100, in the memory system 300, a current of each read bit line is generated by performing a linear combination related to a plurality of working voltages (VDD) according to different weightings. Moreover, each read bit line of the memory system 300 can also introduce a switch and a capacitor. For example, the read bit line RBL(0) can introduce a switch SW(0) to discharge residual charges of a capacitor C' for resetting the read operation. In other words, the switch SW(0) of the read bit line RBL(0) can be used for discharging a voltage sampled in a previous state to 0 volts, thereby increasing operational performance. The first transistor T1' can be a P-type metal oxide semiconductor field effect transistor. The second transistor T2' can be a P-type MOSFET.

Figure 9:
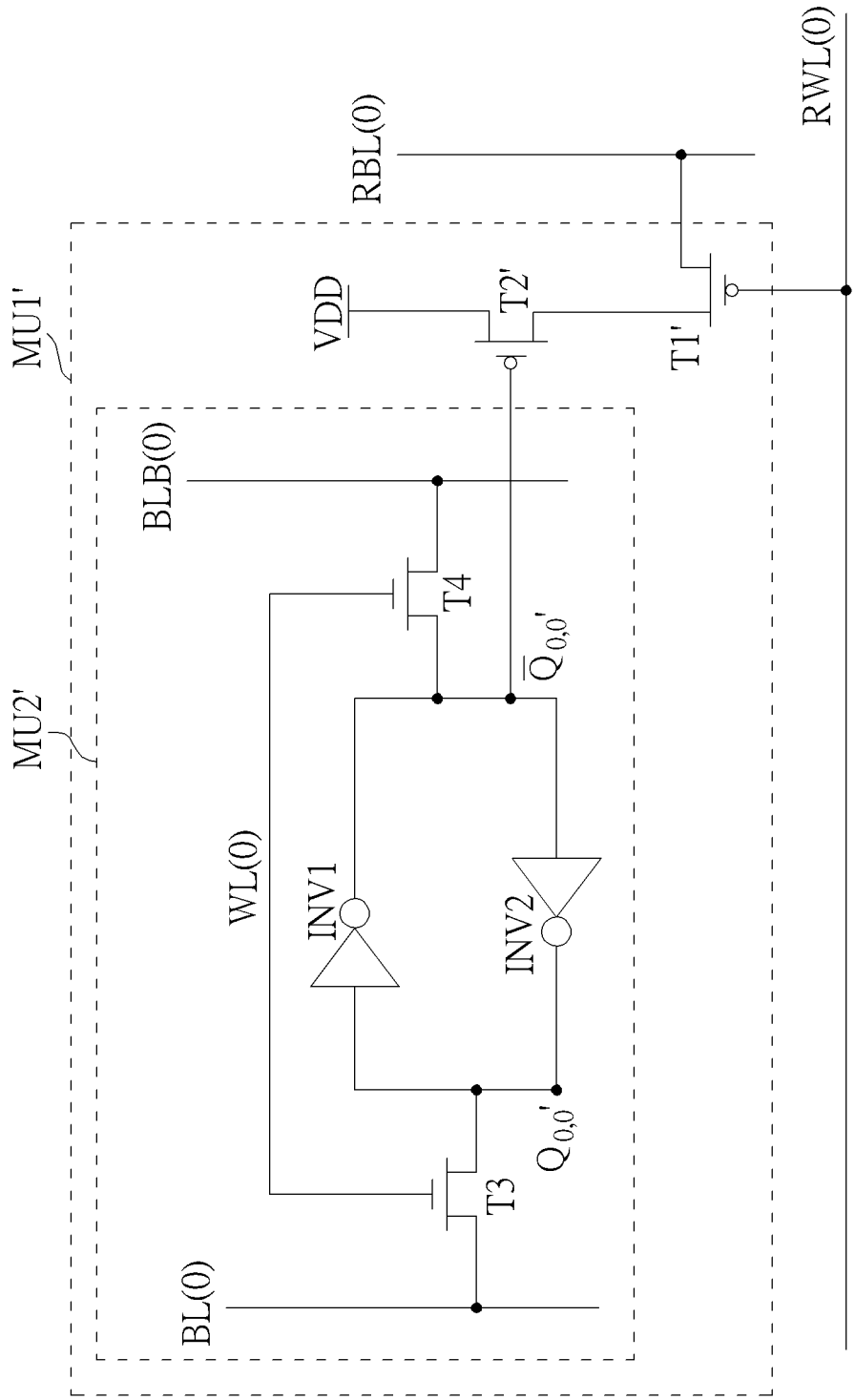
FIG. 9 is a structure of a first memory unit of the memory system in FIG. 8.

FIG. 9 is a structure of a first memory unit MU1' of the memory system 300. As previously mentioned, the first memory unit MU1' includes a second memory unit MU2', a first transistor T1', and a second transistor T2'. The second memory unit MU2' includes a third transistor T3, a fourth transistor T4, a first inverter INV1, and a second inverter INV2. A circuit structure of the second memory unit MU2' is identical as a circuit structure of the second memory unit MU2 in the memory system 100. Therefore, details are omitted here. In the memory system 300, the first terminal of the first transistor T1' is coupled to the first terminal of the second transistor T2'. The control terminal of the first transistor T1' is coupled to the read word line RWL(0). The second terminal of the first transistor T1' is coupled the read bit line RBL(0). The second terminal of the second transistor T2' is used for receiving the working voltage VDD. Two signals of the first bit line BL(0) and the second bit line BLB(0) are complementary.

Figure 10:
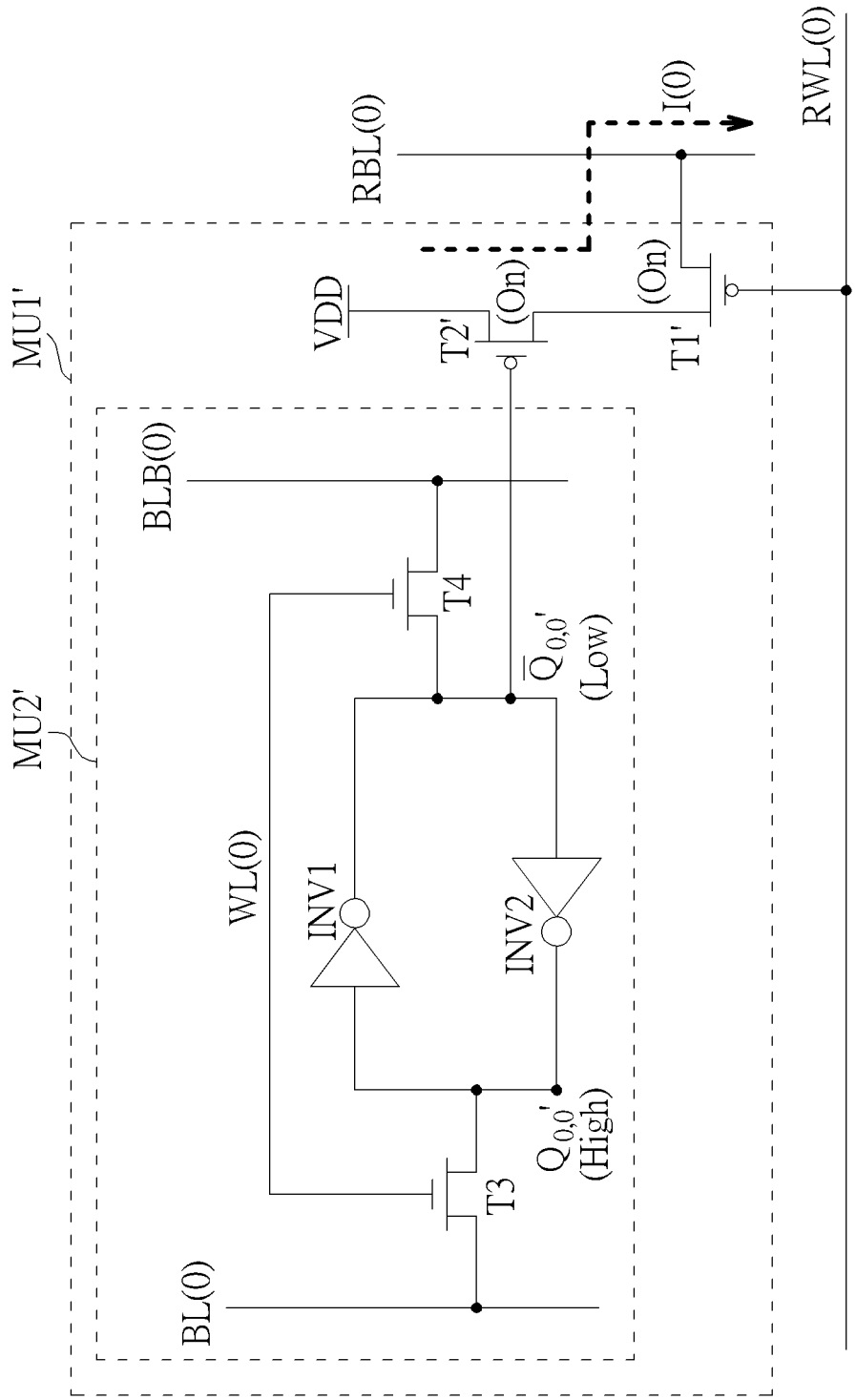
FIG. 10 is an illustration of an output of a read bit line of the memory system in FIG. 8 when a node is at a high voltage.

FIG. 10 is an illustration of an output of the read bit line RBL(0) of the memory system 300 when a node $Q_{0,0}'$ is at a high voltage. In FIG. 10, when the node $Q_{0,0}$ is at the high voltage (i.e., the weighting $W_{0,0}$ is set to indicate the high voltage), it implies that the input terminal of the first inverter INV1 is at the high voltage. Therefore, the input terminal of the second inverter INV2 is at the low voltage. The node $\overline{Q}_{0,0}'$ is at the low voltage. When the read word line RWL(0) is at the low voltage (i.e., when a reverse pulse signal is received), the first transistor T1' and the second transistor T2' are enabled. Therefore, a circuit path is generated between the node of the working voltage VDD and the read bit line RBL(0), Therefore, the read bit line RBL(0) can output the current I(0). In other words, similar to the output result in FIG. 3, when the node $Q_{0,0}'$ is at the high voltage, the read bit line RBL(0) can output a non-zero current I(0) and a non-zero voltage V(0).

Figure 11:
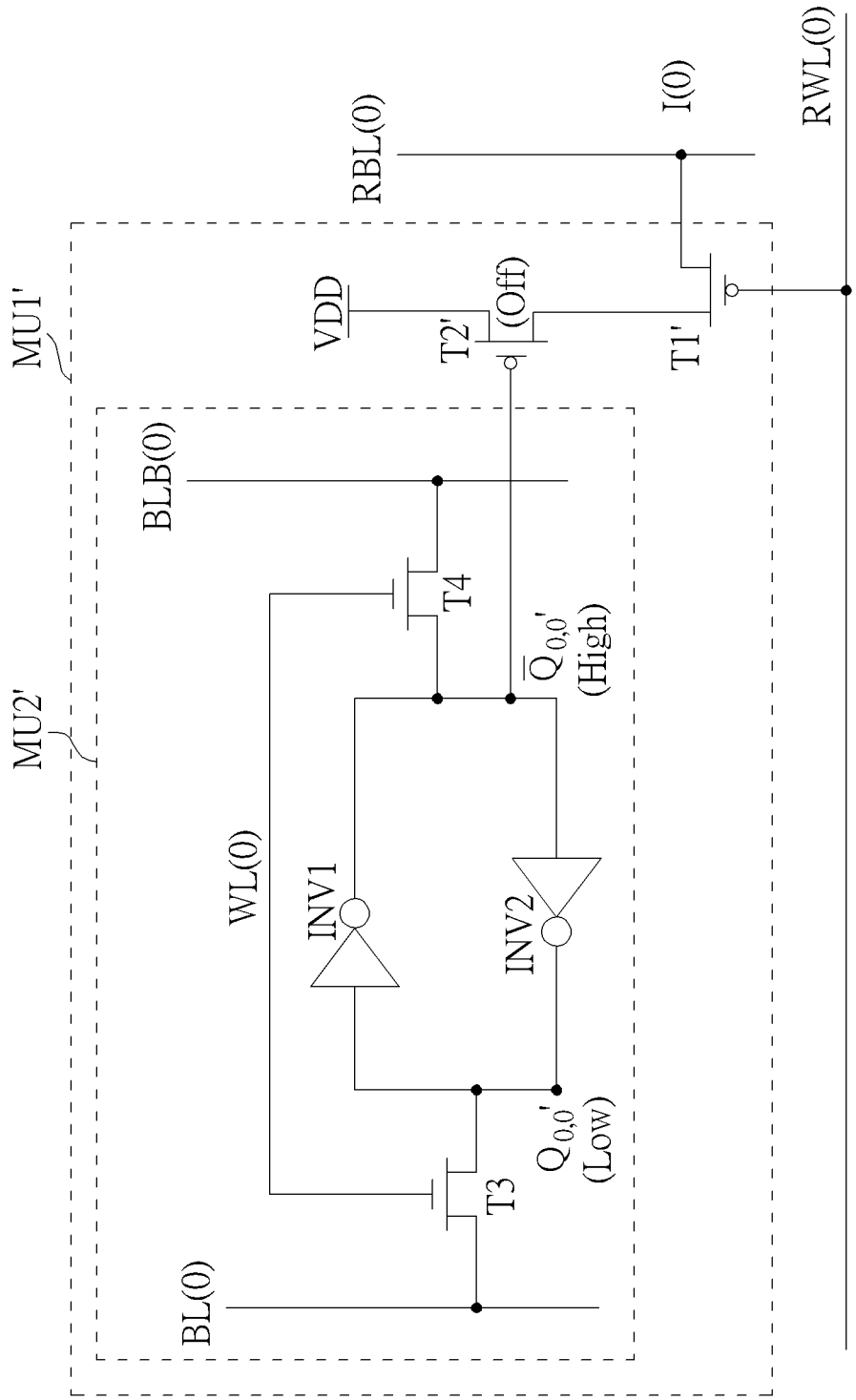
FIG. 11 is an illustration of the output of the read bit line of the memory system in FIG. 8 when the node is at a low voltage.

FIG. 11 is an illustration of the output of the read bit line RBL(0) of the memory system 300 when the node $Q_{0,0}'$ is at the low voltage. In FIG. 11, when the node $Q_{0,0}'$ is at the low voltage, it implies that the input terminal of the first inverter INV1 is at the low voltage. Therefore, the input terminal of the second inverter INV2 is at the high voltage. The node $\overline{Q}_{0,0}'$ is at the high voltage. Therefore, the second transistor T2' is disabled. The current on the read word line RBL(0) is blocked. As a result, the read bit line RBL(0) fails to output any current (I(0)=0). In other words, similar to the output result in FIG. 4, when the node $Q_{0,0}'$ is at the low voltage, a current path is absent between the node of the working voltage VDD and the read bit line RBL(0). As a result, the read bit line RBL(0) cannot output the current.

Further, the mechanism of introducing other circuits to the memory system 300 for performing the bit partitioning process and the internal computation process is illustrated previously. Thus, they are omitted here. The memory system 300 is capable of performing the bit partitioning process and the internal computation process. Any reasonable hardware modification falls into the scope of the present invention.

To sum up, the present invention discloses a memory system. The memory system is capable of performing a bit partitioning process and an internal computation process. Further, in a memory array of the memory system, each memory cell can use two transistors for controlling a current and a voltage of the read bit line. Therefore, currents and voltages of the read bit lines can be linearly combined according to different weightings. Therefore, the memory system of the present invention can be applied to artificial intelligence accelerators. Further, the memory system can use its internal computation capability for reducing power consumption and latency. The memory system uses a plurality of analog-to-digital converters with small dimensions for the bit partitioning process on the time axis, thereby avoiding high design complexity and high energy consumption. Moreover, since the memory system uses a voltage-to-time converter (VTC) and a time-to-digital converter (TDC) for converting voltage signals into digital signals on the time axis, sampling accuracy of the VTC and TDC increases with improvement of the manufacturing process of the VTC and TDC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory system comprising:
   a plurality of first memory units, each first memory unit of the plurality of first memory units comprising:
      a second memory unit;
      a first transistor coupled to the second memory unit; and
      a second transistor coupled to the second memory unit and the first transistor;
   a plurality of read word lines, each read word line of the plurality of read word lines being coupled to a plurality of first transistors disposed along a corresponding row; and
   a plurality of read bit lines, each read bit line of the plurality of read bit lines being coupled to a plurality of second transistors disposed along a corresponding column;
   wherein a current of the each read bit line is generated by performing a linear combination on a plurality of currents of the plurality of read word lines.

2. The system of claim 1, further comprising:
   an input register array configured to receive a plurality of input data vectors;
   a plurality of multiplexers coupled to the input register array and the plurality of read word lines, each multiplexer of the plurality of multiplexers being configured to generate a multiplexer output signal according to the plurality of input data vectors; and
   a control signal generator coupled to the plurality of multiplexers and configured to generate a plurality of control signals for controlling the plurality of multiplexers.

3. The system of claim 1, wherein the second memory unit comprises:
   a third transistor comprising:
      a first terminal coupled to a first bit line;
      a second terminal; and
      a control terminal;
   a fourth transistor comprising:
      a first terminal;
      a second terminal coupled to a second bit line; and
      a control terminal coupled to the control terminal of the third transistor;
   a first inverter comprising:
      an input terminal coupled to the second terminal of the third transistor; and
      an output terminal coupled to the first terminal of the fourth transistor and a control terminal of the second transistor; and
   a second inverter comprising:
      an input terminal coupled to the output terminal of the first inverter; and
      an output terminal coupled to the input terminal of the first inverter and a first terminal of the first transistor;
   wherein a second terminal of the first transistor is coupled to a first terminal of the second transistor, a control terminal of the first transistor is coupled to a read word line of the plurality of read word lines, a second terminal of the second transistor is coupled to a read bit line of the plurality of read bit lines, and two signals of the first bit line and the second bit line are complementary.

4. The system of claim 3, wherein when the input terminal of the first inverter is at a high voltage, the input terminal of the second inverter is at a low voltage, and the first transistor and the second transistor are enabled for outputting a current to the read bit line.

5. The system of claim 3, wherein when the input terminal of the first inverter is at a low voltage, the input terminal of the second inverter is at a high voltage, and the second transistor is disabled so that a current of the read bit line is blocked.

6. The system of claim 1, wherein the first transistor is an N-type metal-oxide-semiconductor field-effect transistor, and the second transistor is a P-type metal-oxide-semiconductor field-effect transistor.

7. The system of claim 1, further comprising:
   a plurality of voltage-to-time converters coupled to the plurality of read bit lines and configured to generate a plurality of output signals in a time domain;
   a plurality of analog-to-digital(A/D) converters, each A/D converter of the plurality of A/D converters being coupled to a corresponding voltage-to-time converter for outputting a digital signal; and
   an output synthesizer coupled to the plurality of A/D converters and configured to generate an output signal;
   wherein a dimension of the each A/D converter is NADC, and NADC is a positive integer.

8. The system of claim 7, wherein the each A/D converter quantizes the output signal of the each read bit line in a time domain into a digital signal with $2^{NADC}$ levels, and the number of A/D converters is smaller than or equal to a column dimension of the plurality of first memory units.

9. The system of claim 7, wherein the output synthesizer sums up sequentially shifted digital signals generated by the plurality of A/D converters for generating the output signal.

10. The system of claim 7, wherein the plurality of A/D converters are a plurality of time-to-digital converters for converting the plurality of output signals in a time domain generated by the voltage-to-time converters into the plurality of digital signals, and sampling accuracy of the voltage-to-time converters increases with improvement of manufacturing process of the voltage-to-time converters.

* * * * *